(12) United States Patent
Tolchinsky et al.

(10) Patent No.: US 6,924,543 B2
(45) Date of Patent: Aug. 2, 2005

(54) METHOD FOR MAKING A SEMICONDUCTOR DEVICE HAVING INCREASED CARRIER MOBILITY

(75) Inventors: Peter G. Tolchinsky, Beaverton, OR (US); Irwin Yablok, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/463,766

(22) Filed: Jun. 16, 2003

(65) Prior Publication Data

US 2004/0251480 A1 Dec. 16, 2004

(51) Int. Cl.$^7$ .............................................. H01L 29/72
(52) U.S. Cl. ........................ 257/510; 257/511; 257/513; 257/200; 438/751
(58) Field of Search ................................ 438/751, 752, 438/404, 424; 257/510, 511, 200, 513

(56) References Cited

U.S. PATENT DOCUMENTS 6,177,359 B1 * 1/2001 Chen et al. .................. 438/751
2004/0113174 A1 * 6/2004 Chidambarrao et al. .... 257/200

* cited by examiner

Primary Examiner—Edward Wojciechowicz
(74) Attorney, Agent, or Firm—Michael D. Plimier

(57) ABSTRACT

A method and apparatus for a semiconductor device having increased electrical carrier mobility is described. That method and apparatus comprises forming two recesses within a substrate, and providing a material within the two recesses. The material has a predetermined coefficient of thermal expansion (CTE) to facilitate introduction of a predetermined strain within the substrate in a location between the two recesses. Also described is a semiconductor device that comprises a substrate having two recesses formed therein, and a material disposed within the two recesses. The material has a predetermined coefficient of thermal expansion (CTE) to facilitate introduction of a predetermined strain within the substrate in a location between the two recesses.

45 Claims, 3 Drawing Sheets

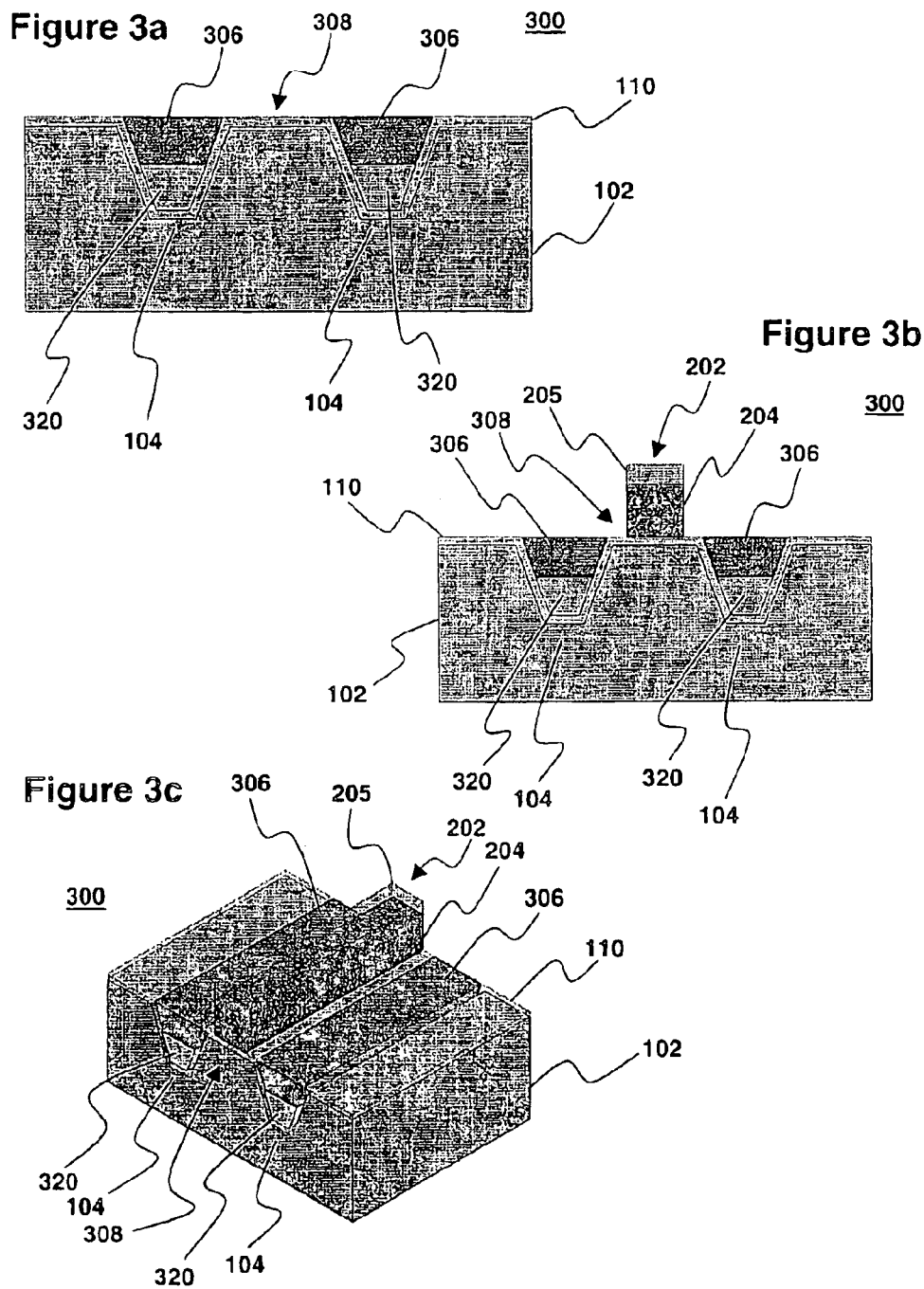

METHOD FOR MAKING A SEMICONDUCTOR DEVICE HAVING INCREASED CARRIER MOBILITY

FIELD OF THE INVENTION

The invention generally relates to methods for making semiconductor devices, in particular, semiconductor devices having increased electrical carrier mobility.

BACKGROUND

Semiconductor materials may be based on various materials. For example, some common semiconductor materials may be silicon (Si) or germanium (Ge) based. Si and Ge may be commonly utilized to make semiconductor devices. For example, semiconductor devices made by MOS processes, such as an insulated gate field-effect transistor (IGFET), may utilize the electrical properties of Si. In particular, many semiconductor devices utilize the electrical carrier abilities of Si. Accordingly, Si is commonly used as a substrate, upon which, various semiconductor devices are formed.

As semiconductor devices become increasingly complex, the demand on the electrical carrier abilities of the semiconductor materials increases. For example, an increase in semiconductor complexity often requires increase in semiconductor performance and power consumption.

It may be possible to address the increased demands on the electrical carrier abilities in a semiconductor by modifying the atomic structure of the semiconductor. One known method of modifying the atomic structure of a semiconductor is to form a thin layer of Si on a layer of SiGe film by a form of epitaxial growth. The layer of Si has a lattice structure that differs from that of the layer of SiGe, and this lattice mismatch results in the Si layer being strained. That is, because of the natural tendency of atoms to align with one another, the layer of Si will strain to match the layer of SiGe. However, the lattice mismatch processes for forming layers of strained Si may be complex because of the requirement of controlling dislocations that may commonly occur due to the lattice mismatch.

BRIEF DESCRIPTION OF THE DRAWINGS

The invention is illustrated by way of example and not by way of limitation in the figures of the accompanying drawings, in which the like references indicate similar elements and in which:

FIGS. 3a–3c illustrate structures that may be formed, in accordance with various alternate embodiments of the invention.

DETAILED DESCRIPTION

In various embodiments, a method and apparatus for a semiconductor device having increased electrical carrier mobility is described. In the following description, various embodiments will be described. However, one skilled in the relevant art will recognize that the various embodiments may be practiced without one or more of the specific details, or with other methods, materials, components, etc. In other instances, well-known structures, materials, or operations are not shown or described in detail to avoid obscuring aspects of various embodiments of the invention. Similarly, for purposes of explanation, specific numbers, materials and configurations are set forth in order to provide a thorough understanding of the invention. Nevertheless, the invention may be practiced without the specific details. In other instances, well-known features are omitted or simplified in order not to obscure the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, materials, or characteristics may be combined in any suitable manner in one or more embodiments.

Various operations will be described as multiple discrete steps in turn, in a manner that is most helpful in understanding the invention. However, the order of description should not be construed as to imply that these operations are necessarily order dependent. In particular, these operations need not be performed in the order of presentation.

Figure 1A:
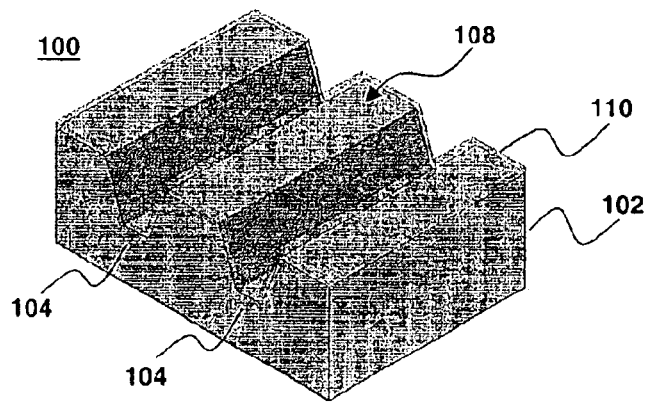
FIGS. 1a–1c illustrate structures that may be formed, when carrying out various embodiments of the invention.
Figure 1B:
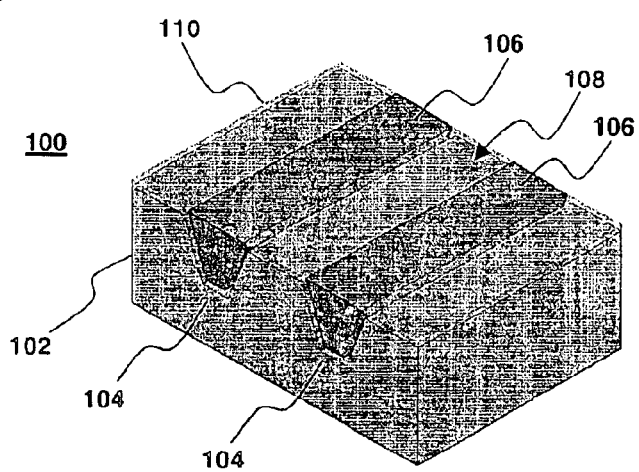
Figure 1C:
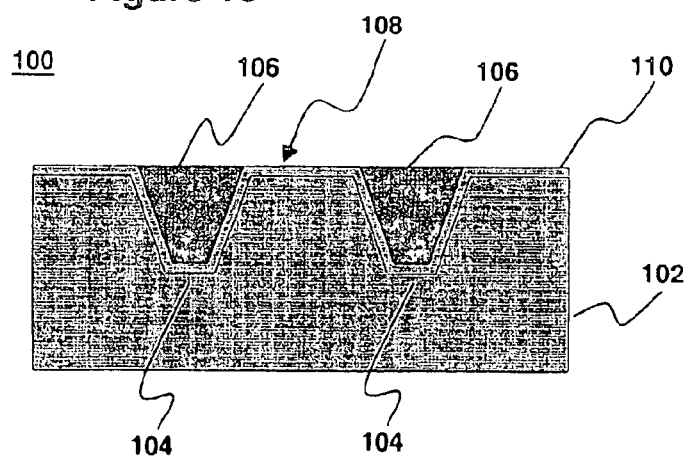

FIGS. 1a–1c illustrate structures that may be formed, when carrying out various embodiments of the invention. Illustrated in FIG. 1a is an isometric type view of an apparatus 100. As shown in FIG. 1a, apparatus 100 comprises of a substrate 102 having two recesses 104 formed within the substrate 102. Referring to FIG. 1b, a material 106 having a predetermined coefficient of thermal expansion (CTE) is provided within the two recesses 104 as shown in an isometric type view. As will be described in further detail, the material 106 facilitates introduction of a predetermined strain within the substrate 102 in a location between the two recesses 108 (hereon out, referred to as strain area). As a result, electrical carrier mobility of the substrate 102 may be increased, in particular, the electrical carrier mobility of substrate 102 in proximity to the strain area 108.

Referring now to FIG. 1c, the substrate 102, having the two recesses 104 and the material 106, is shown in a cross-sectional type view. As previously alluded to, providing the material 106 within the two recesses 106 facilitates introduction of strain in proximity to the strain area 108. That is, providing a material with a large CTE as compared to the substrate material may cause strain in the substrate between the two recesses 104.

In one embodiment, the substrate 102 may comprise of a Si material, and the material 106 may comprise of a silicon nitride material ($Si_3N_4$). In this embodiment, the material 108 having a predetermined CTE larger than that of substrate 102 may cause a predetermined strain (e.g., a tensile strain) in the strain area 108 between the two recesses 104. That is, in the case of Si, the diamond cubic lattice structure of Si may be distorted due to the introduction of strain. As a result, the strain area 108 may experience an increase in electrical carrier mobility, which in turn, may reduce power consumption by the semiconductor device 100.

In one embodiment, the substrate 102 may comprise of bulk Si or Si-on-insulator substructure. Alternatively, substrate 102 may comprise of other materials, which may or may not be combined with Si, such as germanium, indium antimonide, lead telluride, indium arsenide, indium phosphide, gallium arsenide, or gallium antimonide. Although several examples of materials from which substrate 102 may be formed are described, any material that may serve as a foundation upon which a semiconductor device may be built falls within the spirit and scope of the invention.

The two recesses may be of isolation type structures such as, but not limited to, trench isolation structures. That is, the two recesses 104 may be of any type of isolation type structures such as, but not limited to, shallow trench isolation structures and deep trench isolation structures. Referring to FIGS. 1a–1c, in one embodiment, the two recesses 104 may be formed by an etching process with the side walls being at approximately 75–80°. Subsequently, a thin layer of insulating material 110 such as, but not limited to, silicon dioxide ($SiO_2$) may be formed on the substrate 102 including within the two recesses 104. On the insulating layer 110 and within the two recesses 104, the material 106 having the predetermined CTE may be provided. Alternatively, the shape of the recesses 104 may vary, and may be application dependent.

The two recesses 104 may be formed utilizing conventional forming methods involving removal of material such as etching, e.g., patterning and etching lithography processes. Insulating material 110 may be formed on the substrate 102 utilizing conventional methods involving deposition such as, but not limited to, conventional chemical vapor deposition (CVD), low pressure CVD, and physical vapor deposition (PVD) processes. Additionally, the material 106 may be disposed within the two recesses 104 of the substrate 102 utilizing conventional deposition methods such as plasma-enhanced CVD (PECVD) including high-density PECVD. Additionally, conventional polishing methods may be utilized such as, but not limited to, chemical mechanical polishing (CMP) to remove excess insulation material.

The thicknesses of the layer of insulating material 110 and the material 106 may be based at least in part on the amount of strain introduced into the strain area 108. That is, the insulating material 110 may facilitate to modify the effects of the material 106 in facilitating introduction of strain. Accordingly, in various embodiments, the insulating material 110 may be utilized to form a buffer type layer (i.e., thickness of the insulating layer 110 corresponds to the amount of strain introduced in the strain area 108). Utilizing the insulating material 110 as a buffer type layer may aid in controlling dislocation formation within the substrate 102, in particular, in the strain area 108.

In the various embodiments illustrated in FIGS. 1a–1c, the substrate 102 has two recesses 104. However, it should be appreciated by those skilled in the art that the number of recesses may be any number based at least in part on the semiconductor device. Accordingly, the number of recesses may be any number to facilitate introduction of strain in any number of strain areas.

For example, a substrate may have even or odd number of recesses. By providing a material having a predetermined CTE within the recesses, introduction of strain within the various strain areas between the recesses may be facilitated. Accordingly, in various embodiments, the type of strain introduced in the strain areas may be other types of strain such as, but not limited to, compressive strain, and may be based at least in part on the material properties Further, selection of materials having various CTEs may also be application dependent.

It should be appreciated by those skilled in the art that the apparatus 100 illustrated in FIGS. 1a–1c may be a portion thereof, and does not necessarily show the entire apparatus such as a semiconductor device. Accordingly, in order to not obscure the various embodiments of the invention, various formations, layers, devices, and so forth have been omitted.

The apparatus 100 may be any number of various semiconductor devices such as, but not limited to semiconductor devices made by MOS processes including various insulated gate field-effect transistors (IGFETs).

Figure 2A:
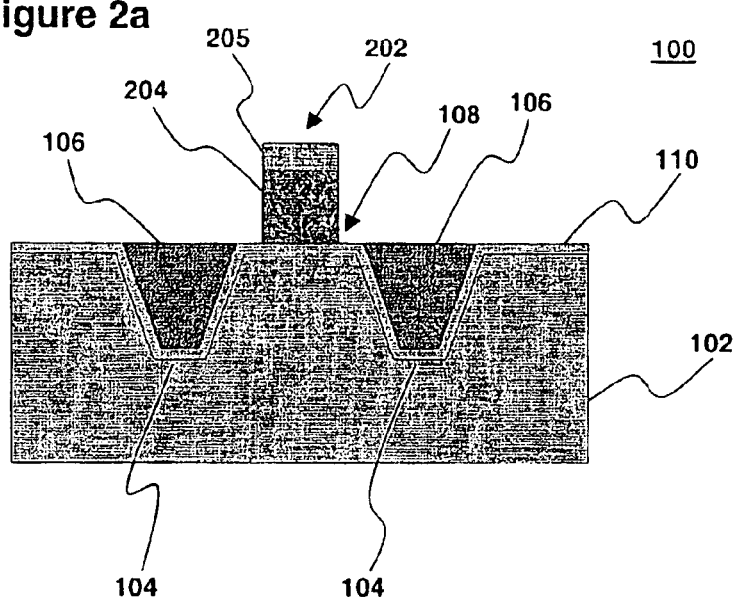
FIGS. 2a–2b illustrate a substrate having a control terminal disposed on a strain area, in accordance with various embodiments of the invention.
Figure 2B:
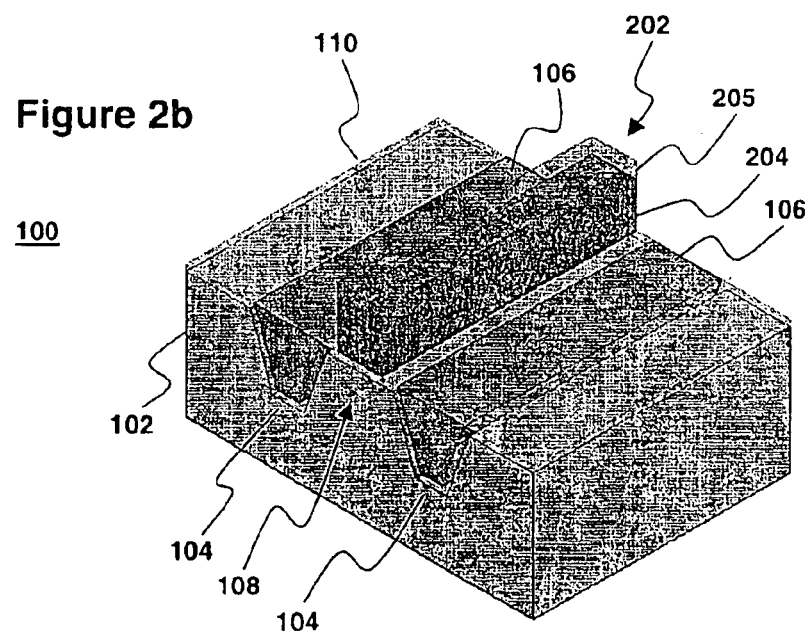

FIGS. 2a–2b illustrate a substrate having a control terminal disposed on a strain area, in accordance with various embodiments of the invention. Shown in FIG. 2a is a cross-sectional type view of the substrate 102 having the two recesses 104. The material 106 may be disposed within the two recesses 104. Continuing to refer to FIG. 2a, a control terminal 202 may be disposed on the strain area 108. In one embodiment, the control terminal 202 may be a gate electrode. As shown for the embodiment, the strain area 108 may be utilized as a body terminal for the control terminal 202 such as, but not limited to, a channel. As shown in FIG. 2a, the control terminal 202 may comprise of various layers such as, but not limited to, a polysilicon type gate electrode, which may include various layers 204–205. For example, one layer 204 disposed on the strain area 108 may be a of a polycrystalline Si (e.g., polysilicon) type gate electrode, and a second layer 205 may be a polycide type of material. Accordingly, the control terminal 202 may be formed in various conventional methods.

FIG. 2b illustrates an isometric type view of the apparatus 100 having the control terminal 202 disposed on the strain area 108 as previously described with respect to FIG. 2a, in accordance with various embodiments of the invention.

FIGS. 3a–3c illustrate structures that may be formed, in accordance with various alternate embodiments of the invention. Shown in FIG. 3a is an apparatus 300 that comprises of a substrate 102 having two recesses 104 formed within the substrate 102. Further, in the various embodiments illustrated in FIGS. 3a–3c, substrate 102 also includes the insulating layer 110 as previously described.

In the embodiment illustrated in FIGS. 3a–3b, disposed within the two recesses 104 may be two dissimilar materials, a first material 306 and a second material 320. As illustrated, the first and second materials 306 & 320 may be disposed in a predetermined proportion. That is, the first material 306 may be disposed to fill a portion of the two recesses 104, while the second material 320 may be disposed to fill another portion of the two recesses 104. For example, referring to FIG. 3a, a top half of the two recesses 104 may have the first material 306, while a bottom half of the two recesses may have the second material 320. In one embodiment, the first material 306 may be $Si_3N_4$, while the second material 320 may be $SiO_2$.

Continuing to refer to FIG. 3a, providing dissimilar materials (i.e., the first material 306 and the second material 320) may facilitate varying areas of strain within a strain area 308. For example, the first material 306 may facilitate introduction of strain in proximity to the portion that it occupies within the two recesses 104. That is, as in the example previously described, the first material having a CTE that is much larger than the CTE of the substrate 102 facilitates introduction of strain within the strain area 308 approximately corresponding to the portion of the first material 306. However, the second material 320 may have a CTE that may be substantially similar to the CTE of the substrate resulting in minimal strain within the strain area 308 in proximity to the second material 320.

Shown in FIG. 3b is a cross-sectional type view of the substrate 102 having the two recesses 104. The two recesses 104 have the first and second materials 306 & 320. Continuing to refer to FIG. 3b, a control terminal 202 may be disposed on the strain area 308. As previously described, in one embodiment, the control terminal 202 may be a gate electrode having various layers 204–205.

FIG. 3c illustrates an isometric type view of the apparatus 300 having the control terminal 202 disposed on the strain area 308 as previously described with respect to FIG. 3a–3b, in accordance with one embodiment of the invention. That is, the two recesses 104 have the first and second materials 306 & 320 in the predetermined proportion to facilitate introduction of varying areas of strain.

Here again, the two recesses 104 may be formed utilizing conventional removal methods such as etching, e.g., patterning and etching lithography processes. Insulating material 110 may be formed on the substrate 102 utilizing conventional methods as previously described. The first and second materials 306 & 320 may be disposed within the two recesses 104 utilizing conventional deposition methods as previously described. Additionally, conventional polishing methods may be utilized.

In the various embodiments illustrated in FIGS. 3a–3c, two dissimilar materials 306 & 320 are shown. However, more than two dissimilar materials may be disposed within the recesses. Further, as previously described, the number of recesses may be any number. The selection of the dissimilar materials may be application dependent, and may be based at least in part on the various materials utilized in the apparatus (i.e., the semiconductor device).

Having described and illustrated the principles of the invention with reference to illustrated embodiments, it will be recognized that the illustrated embodiments can be modified in arrangement and detail without departing from such principles. And, though the foregoing discussion has focused on particular embodiments, other configurations are contemplated. In particular, even though expressions such as "in one embodiment," "in another embodiment," or the like are used herein, these phrases are meant to generally reference embodiment possibilities, and are not intended to limit the invention to particular embodiment configurations. As used herein, these terms may reference the same or different embodiments that are combinable into other embodiments.

Thus, it can be seen from the above descriptions, a novel method and apparatus for a semiconductor device having increased electrical carrier mobility, has been described.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Thus, the description is to be regarded as illustrative instead of restrictive on the invention.

Consequently, in view of the wide variety of permutations to the embodiments described herein, this detailed description is intended to be illustrative only, and should not be taken as limiting the scope of the invention. What is claimed as the invention, therefore, is all such modifications as may come within the scope and spirit of the following claims and equivalents thereto.

What is claimed is:

1. A method for making a semiconductor device comprising:
    forming two recesses within a substrate, the substrate having a first predetermined coefficient of thermal expansion (CTE);
    providing a first layer of a first material within each of the two recesses, the first material having a second predetermined CTE to facilitate introduction of a first predetermined strain in a first area within the substrate in a location between the two recesses; and
    providing a second layer of a second material within each of the two recesses, the second material having a third predetermined CTE to facilitate introduction of a second predetermined strain in a second area within the substrate in a location between the two recesses, the first and second strains being different.

2. The method of claim 1, wherein said providing comprises providing the first and second materials having CTEs to facilitate introduction of tensile strains within the substrate between the two recesses.

3. The method of claim 1, wherein said forming comprises forming isolation structures.

4. The method of claim 3, wherein said forming comprises etching the substrate to form shallow trench isolation structures.

5. The method of claim 3, wherein said forming comprises etching the substrate to form deep trench isolation structures.

6. The method of claim 1, wherein said forming comprises forming two recesses within a substrate made of silicon material.

7. The method of claim 1, wherein the first and second materials comprise two dissimilar materials.

8. The method of claim 7, wherein one of the two dissimilar materials comprises silicon nitride and the other comprises silicon dioxide.

9. The method of claim 1 further comprising:
    forming an insulating layer within the two recesses, between the substrate and first and second layers of first and second materials.

10. The method of claim 1, wherein the location between the two recesses comprises of a body terminal.

11. The method of claim 10, wherein the body terminal comprises a channel.

12. The method of claim 1 further comprises forming a control terminal on the substrate in the location between the two recesses.

13. The method of claim 12, wherein the control terminal comprises a gate electrode.

14. The method of claim 1, wherein the recesses do not extend all the way through the substrate.

15. The method of claim 1, wherein the two recesses have side walls at an angle in a range from about 75 degrees to about 80 degrees relative to a top surface of the substrate.

16. The method of claim 1, wherein a height of the first layer plus a height of the second layer is less than or equal to a depth of the two recesses.

17. The method of claim 16, wherein the first material comprises silicon nitride and the second material comprises silicon dioxide.

18. The method of claim 9, wherein the insulating layer comprises silicon dioxide.

19. A semiconductor device, comprising:
    a substrate, the substrate having two recesses formed therein, and having a first coefficient of thermal expansion (CTE); and a first layer of a first material disposed within each of the two recesses, the first material having a second predetermined coefficient of thermal expansion (CTE) to facilitate introduction of a first predetermined strain in a first area within the substrate in a location between the two recesses; and a second layer of a second material disposed within each of the two recesses, the second material having a third predetermined CTE to facilitate introduction of a second predetermined strain in a second area within the substrate in a location between the two recesses, the first and second strains being different.

20. The semiconductor device of claim 19, wherein the first and second materials comprise materials having CTEs to facilitate introduction of tensile strains within the substrate in the location between the two recesses.

21. The semiconductor device of claim 19, wherein the two recesses comprise of isolation structures.

22. The semiconductor device of claim 21, wherein the two recesses comprise of shallow trench isolation structures.

23. The semiconductor device of claim 21, wherein the two recesses comprise of deep trench isolation structures.

24. The semiconductor device of claim 19, wherein the substrate comprises a substrate made of silicon material.

25. The semiconductor device of claim 19, wherein the first and second materials comprise two dissimilar materials.

26. The semiconductor device of claim 19, wherein the two dissimilar materials comprise of a predetermined proportion of silicon nitride and silicon dioxide, the predetermined proportion to facilitate introduction of varying areas of tensile strain within the substrate in the location between the two recesses.

27. The semiconductor device of claim 19 comprising an insulating layer between the substrate and the first and second layers of first and second materials within each of the two recesses.

28. The semiconductor device of claim 19, wherein the location between the two recesses comprises of a body terminal.

29. The semiconductor of claim 28, wherein the location between the two recesses comprises of a channel.

30. The semiconductor device of claim 19 further comprises a control terminal on the substrate in the location between the two recesses.

31. The semiconductor device of claim 30, wherein the control terminal comprises a gate electrode.

32. The device of claim 19, wherein the recesses do not extend all the way through the substrate.

33. The device of claim 19, wherein the two recesses have side walls at an angle in a range from about 75 degrees to about 80 degrees relative to a top surface of the substrate.

34. The device of claim 19, wherein the height of the first layer plus a height of the second layer being less than or equal to a depth of the two recesses.

35. The device of claim 34, wherein the first material comprises silicon nitride and the second material comprises silicon dioxide.

36. The device of claim 27, wherein the insulating layer comprises silicon dioxide.

37. The device of claim 36, wherein each of the first and second layers are in direct contact with the insulating layer.

38. The device of claim 19, wherein the first CTE is less than the third CTE and the third CTE is less than the second CTE.

39. The device of claim 19, wherein each recess extends from a first surface of the substrate to a depth beneath the first surface of the substrate, and the second layer is further from the first surface of the substrate than the first layer.

40. The device of claim 39, wherein each recess has a volume and each of the first layer and the second layer fills at least one-fourth of the volume.

41. The device of claim 40, wherein the first layer comprises silicon nitride and the second layer comprises silicon dioxide.

42. The device of claim 39, wherein the thickness of the first layer is about equal to the thickness of the second layer.

43. The device of claim 39, wherein the first layer comprises silicon nitride and the second layer comprises silicon dioxide and further comprising an insulating layer between the substrate and the first and second layers.

44. The device of claim 27, wherein each recess has a volume, and the first layer fills up at least about half of the volume not filled by the insulating layer.

45. The device of claim 27, wherein each recess has a volume and wherein the insulating layer, the first layer, and the second layer together fill substantially all the volume.

* * * * *